(12) United States Patent
Li et al.

(10) Patent No.: US 12,199,600 B2
(45) Date of Patent: Jan. 14, 2025

(54) DRIVING CIRCUIT AND CIRCUIT SYSTEM THEREOF

(71) Applicant: NUVOTON TECHNOLOGY CORPORATION, Hsinchu (TW)

(72) Inventors: Cheng-Tao Li, Hsinchu (TW); Wei-Jean Liu, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 70 days.

(21) Appl. No.: 18/304,114

(22) Filed: Apr. 20, 2023

(65) Prior Publication Data

US 2023/0403004 A1     Dec. 14, 2023

(30) Foreign Application Priority Data

Jun. 8, 2022     (TW) .................................. 111121333

(51) Int. Cl.
*H03K 17/567* (2006.01)
*H03K 17/06* (2006.01)
*H03K 17/60* (2006.01)
*H03K 17/687* (2006.01)

(52) U.S. Cl.
CPC ......... *H03K 17/567* (2013.01); *H03K 17/063* (2013.01); *H03K 17/60* (2013.01); *H03K 17/6872* (2013.01)

(58) Field of Classification Search
CPC .... H03K 17/567; H03K 17/063; H03K 17/60; H03K 17/6872; G05F 3/242; G05F 3/20; G05F 3/30; G05F 3/24; G05F 3/245; G05F 3/247
See application file for complete search history.

(56) References Cited

U.S. PATENT DOCUMENTS 5,144,223 A * 9/1992 Gillingham ............... G05F 3/30
                                                         323/907

* cited by examiner

*Primary Examiner* — Jung Kim
(74) *Attorney, Agent, or Firm* — MUNCY, GEISSLER, OLDS & LOWE, P.C.

(57) ABSTRACT

In a driving circuit, a drain of first NMOS transistor receives current with a positive temperature coefficient provided by current source, and a gate of first NMOS transistor and a gate of second NMOS transistor are electrically connected to the drain of first NMOS transistor. A drain and a source of second NMOS transistor respectively receive an input voltage and generate an output voltage for driving a load. Two ends of resistor are respectively electrically connected to a source of first NMOS transistor and an emitter of PNP bipolar junction transistor. A base of PNP bipolar junction transistor is electrically connected to a source of second NMOS transistor, and a collector of PNP bipolar junction transistor is electrically connected to a low voltage. By selecting the resistance value of the resistor, an overdrive voltage or a turned-on resistance value of second NMOS transistor is independent of a temperature variation.

14 Claims, 7 Drawing Sheets

DRIVING CIRCUIT AND CIRCUIT SYSTEM THEREOF

BACKGROUND OF THE DISCLOSURE

1. Field of the Disclosure

The present disclosure relates to a driving circuit utilized in a circuit system, and particularly to a driving circuit which an overdrive voltage or a turned-on resistance of a driving transistor thereof is independent of temperature.

2. Description of the Related Art

In the application of the existing driving circuit, maintaining an overdrive voltage (Vov) of the fixed driving transistor may reduce the variation of the turned-on resistance value of the driving transistor. For a conventional driving circuit, a series of MOS transistors with connecting diodes are added to the gate end and the source end of the driving transistor respectively, so that the overdrive voltage Vov is in the range of several times the threshold voltage Vth of the MOS transistor. For example, the overdrive voltage Vov of the driving transistor may be double the threshold voltage Vth minus the drain-source voltage difference $V_{DS}$ of the MOS transistor, that is, Vov=2Vth–$V_{DS}$. The mentioned method may reduce the variation of the overdrive voltage Vov. However, because the threshold voltage Vth will change with temperature variation, the overdrive voltage Vov will change with temperature variation, too. Meanwhile, the degree of variation is about several times the temperature coefficient of the threshold voltage Vth. On the other hand, the turned-on resistance value $R_{DS(ON)}$ of the driving transistor is related to the mobility and the overdrive voltage, and a driving circuit with a fixed turned-on resistance value $R_{DS(ON)}$ is a major requirement for this industry.

SUMMARY OF THE DISCLOSURE

An embodiment of the present disclosure provides a driving circuit, and the driving circuit includes a current source, a first NMOS transistor, a second NMOS transistor, a first resistor and a first PNP bipolar junction transistor. The current source is configured to provide a current with positive temperature coefficient. A drain of the first NMOS transistor is electrically connected to the current source and configured to receive the current, and a gate of the first NMOS transistor is electrically connected to a drain of the first NMOS transistor. A gate of the second NMOS transistor is electrically connected to the drain of the first NMOS transistor, a drain of the second NMOS transistor is configured to receive an input voltage, and a source of the second NMOS transistor is configured to generate an output voltage for driving a load. A first end of the first resistor is electrically connected to a source of the first NMOS transistor. An emitter of the first PNP bipolar junction transistor is electrically connected to a second end of the first resistor, a base of the first PNP bipolar junction transistor is electrically connected to the source of the second NMOS transistor, and a collector of the first PNP bipolar junction transistor is electrically connected to a low voltage. The mentioned driving circuit may make the overdrive voltage or the turned-on resistance value of the second NMOS transistor, as the driving transistor, be independent of the temperature variation.

An embodiment of the present disclosure provides a driving circuit, and the driving circuit comprises a current source, a first NMOS transistor, a second NMOS transistor, a first resistor and a first PMOS transistor. The current source is configured to provide a current with positive temperature coefficient. A drain of the first NMOS transistor is electrically connected to the current source, and configured to receive the current, and a gate of the first NMOS transistor is electrically connected to the drain of the first NMOS transistor. A gate of the second NMOS transistor is electrically connected to the drain of the first NMOS transistor, a drain of the second NMOS transistor is configured to receive an input voltage, and a source of the second NMOS transistor is configured to generate an output voltage for driving a load. A first end of the first resistor is electrically connected to a source of the first NMOS transistor. A source of the first PMOS transistor is electrically connected to a second end of the first resistor, a gate of the first PMOS transistor is electrically connected to the source of the second NMOS transistor, and a drain of the first PMOS transistor is electrically connected to a low voltage. The above driving circuit may make overdrive voltage or turned-on resistance value of the second NMOS transistor, as a driving transistor, be independent of the temperature variation.

An embodiment of the present disclosure further provides a circuit system, and the circuit system includes any one of the mentioned driving circuit and a load electrically connected to the driving circuit.

To sum up, the present disclosure provides a driving circuit utilized in a circuit system, which is designed so that the overdrive voltage or turned-on resistance value is independent of the temperature variation.

In order to further understand the technology, means and effects of the present disclosure, reference may be made to the following detailed description and drawings, so that the objects, features and concepts of the present disclosure can be fully and specifically understood. However, the following detailed description and drawings are only used to refer and illustrate the implementation of the present disclosure, and are not intended to limit the present disclosure.

BRIEF DESCRIPTION OF THE DRAWINGS

The drawings are provided to enable person having ordinary skill in the art to further understand the present disclosure, and the drawings are incorporated in and constitute a part of the specification of the present disclosure. The drawings illustrate exemplary embodiments of the present disclosure, and the description in the specification of the present disclosure is used to explain the principle of the present disclosure.

DESCRIPTION OF THE PREFERRED EMBODIMENTS

The following embodiments of the present disclosure are herein described in detail with reference to the accompanying drawings. These drawings show specific examples of the embodiments of the present disclosure. These embodiments are provided so that this disclosure will be thorough and complete, and will fully convey the scope of the disclosure to those skilled in the art. It is to be acknowledged that these embodiments are exemplary implementations and are not to be construed as limiting the scope of the present disclosure in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

In order to solve the above-mentioned conventional problems, an embodiment of the present disclosure provides a driving circuit, wherein the overdrive voltage or the turned-on resistance value of a driving transistor thereof is independent of the temperature variation. The driving circuit mainly uses a current with a positive temperature coefficient and a predetermined resistance value to compensate a voltage difference between two ends of the last transistor connected between a source and a gate of the driving transistor, so that the overdrive voltage or the turned-on resistance value of the driving transistor is independent of the temperature variation, thereby providing a stabile driving voltage for a load in a circuit system.

Furthermore, an embodiment of the present disclosure further provide a circuit system, and the circuit system includes the mentioned driving circuit and the load, wherein the load is electrically connected to the driving circuit, and the load is driven by an output voltage of the driving circuit. The load, for example, is a digital signal processing circuit, an audio processing circuit or a memory circuit in this embodiment, but the disclosure is not limited thereto.

Figure 1A:
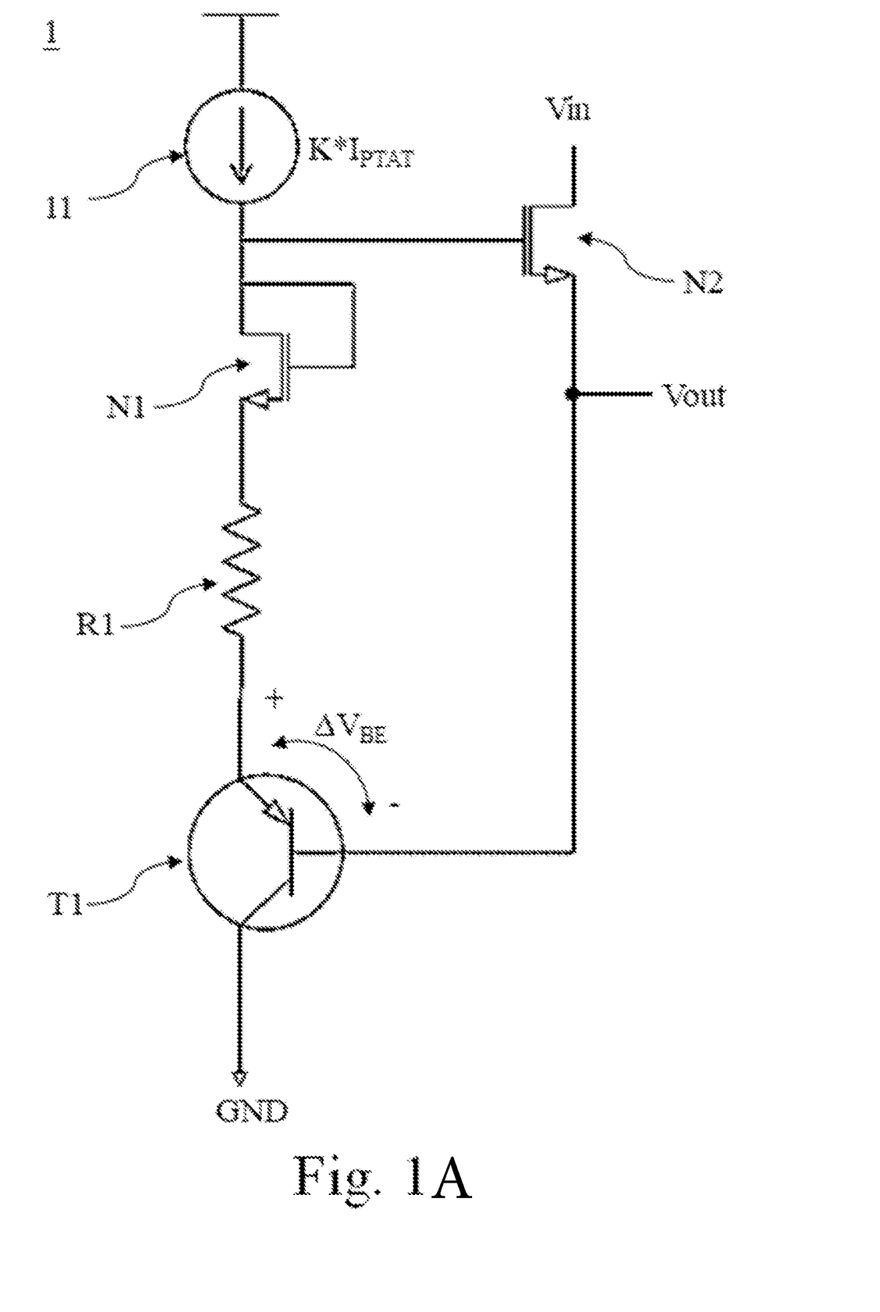
FIG. 1A is a circuit diagram of a driving circuit according to the first embodiment of the present disclosure.

First, please refer to FIG. 1A, FIG. 1A is a circuit diagram of a driving circuit according to the first embodiment of the present disclosure. The driving circuit 1 comprises a current source 11, NMOS transistors N1, N2, a resistor R1, and a PNP bipolar junction transistor T1. A current provided by the current source 11 is proportional to the temperature, for example, the current increases as the temperature rises, and the current decrease as the temperature falls; that is, the current source 11 provides the current with positive temperature coefficient. For example, the current value is to $K*I_{PTAT}$, wherein K is the amplification proportional, and $I_{PTAT}$ is a current value proportional to the temperature.

A drain of the NMOS transistor N1 is electrically connected to the current source 11, so as to receive the current provided by the current source 11, and a gate of the NMOS transistor N1 is electrically connected to a drain of the NMOS transistor N1. The NMOS transistor N2 is used as a driving transistor of the driving circuit, a gate of the NMOS transistor N2 is electrically connected to a drain of the NMOS transistor N1, a drain of the NMOS transistor N2 receives an input voltage Vin, and a source of the NMOS transistor N2 is configured to generate an output voltage Vout to drive the load (Not shown). Two ends of the resistor R1 are respectively electrically connected to a source of the NMOS transistor N1 and an emitter of the PNP bipolar junction transistor T1. A base of the PNP bipolar junction transistor T1 is electrically connected to the source of the NMOS transistor N2, and a collector of the PNP bipolar junction transistor T1 is electrically connected to a ground voltage GND or other low voltage, for example, a negative system voltage.

Figure 1B:
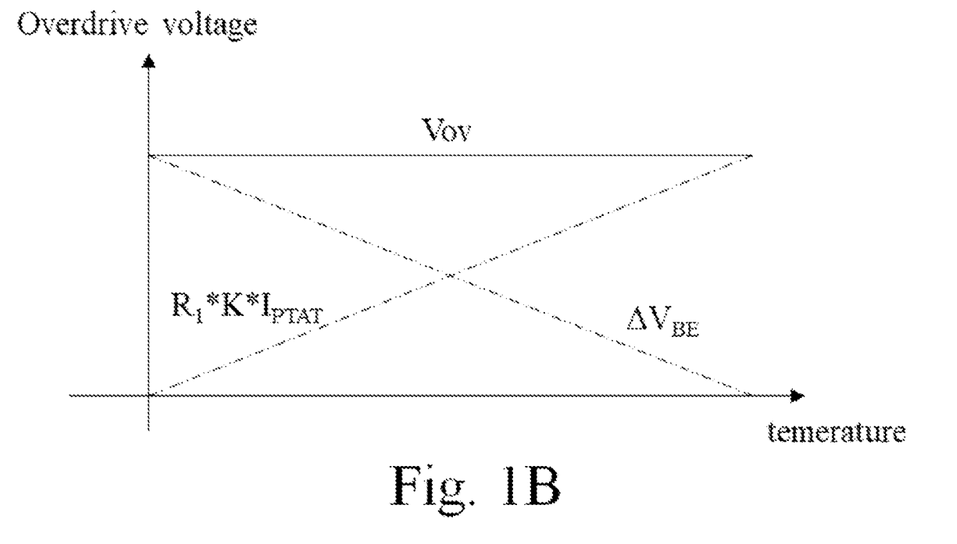
FIG. 1B is a curve diagram of an overdrive voltage and temperature of a driving transistor in the driving circuit of FIG. 1A.

The definition of the overdrive voltage Vov is that the gate-source voltage difference $V_{GS}$ of the driving transistor minus the threshold voltage Vth of the driving transistor, that is, Vov=$V_{GS}$-Vth. In FIG. 1A, the gate-source voltage $V_{GS}$ of the NMOS transistor N2 is the sum of the base-emitter voltage difference $\Delta V_{BE}$ of the PNP bipolar junction transistor T1, two ends voltage difference of the resistor R1 and the threshold voltage Vth of the NMOS transistor N1, that is, $V_{GS}$=Vth+$R_1*K*I_{PTAT}$+$\Delta V_{BE}$. Therefore, Vov=$R_1*K*I_{PTAT}$+$\Delta V_{BE}$, wherein R1 is the resistance value of the resistor R1. The base-emitter voltage difference $\Delta V_{BE}$ of the PNP bipolar junction transistor T1 decreases as the temperature rises and increases as the temperature falls, that is, $\Delta V_{BE}$ is the voltage difference with negative temperature coefficient (That curve as shown in FIG. 1B), and $R_1*K*I_{PTAT}$ increases as the temperature rises and decrease as the temperature falls (that curve as shown in FIG. 1B). By properly choosing the value of K, the resistance value R1 and/or the current value $I_{PTAT}$, as shown in FIG. 1B, an overdrive voltage Vov independent of the temperature variation may be obtained, wherein the overdrive voltage Vov is only determined by the circuit area ratio of the PNP bipolar junction transistor T1. Furthermore, the resistor R1 is consisted of a mixed resistor to construct a structure in which the resistance value R1 is independent of the temperature variation.

Figure 2A:
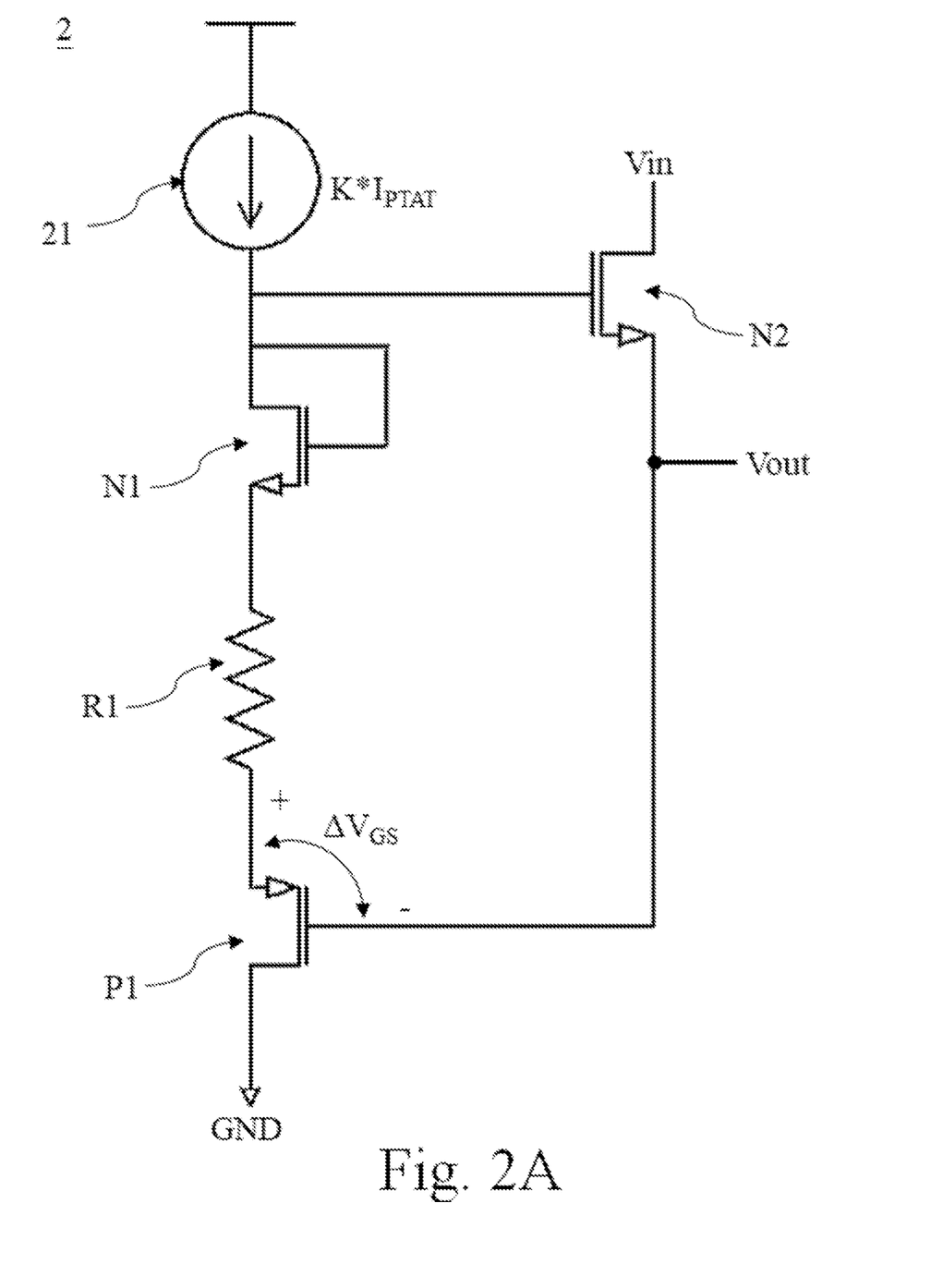
FIG. 2A is a circuit diagram of a driving circuit according to the second embodiment of the present disclosure.

Please refer to FIG. 2A, FIG. 2A is a circuit diagram of a driving circuit according to the second embodiment of the present disclosure. It is different from the embodiment of FIG. 1A that the last transistor connected between the source and the gate of the driving transistor (i.e. the NMOS transistor N2) in FIG. 2A is not the PNP bipolar junction transistor, but the PMOS transistor P1. In this embodiment, the source of the PMOS transistor P1 is electrically connected to one end of the resistor R1, the gate of the PMOS transistor P1 is electrically connected to the source of the NMOS transistor N1 and the drain of the PMOS transistor P1 is electrically connected to the ground voltage GND or other low voltage.

Figure 2B:
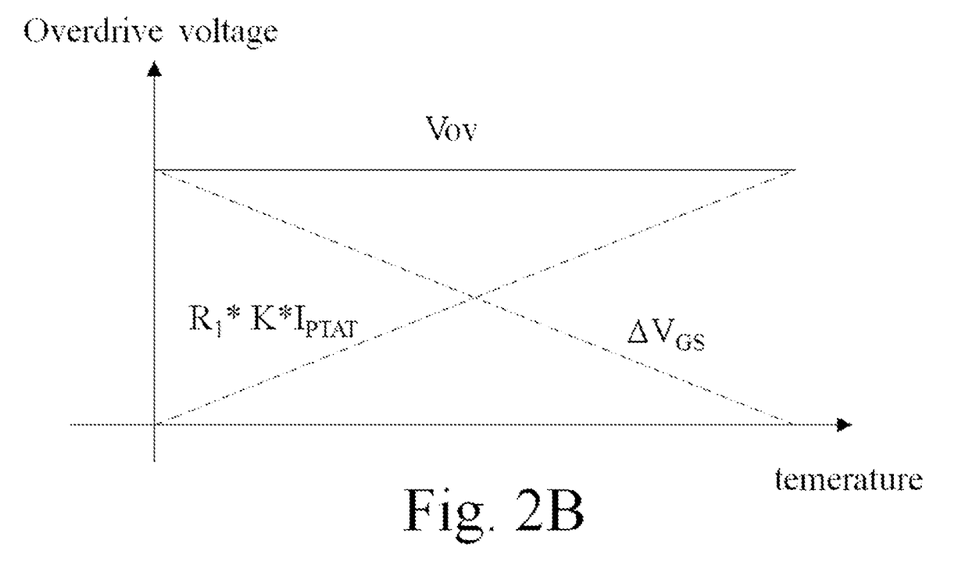
FIG. 2B is a curve diagram of an overdrive voltage and temperature of a driving transistor in the driving circuit of FIG. 2A.

In FIG. 2B, the gate-source voltage $V_{GS}$ of the NMOS transistor N2 is the sum of the gate-source difference voltage $\Delta V_{GS}$ of the PMOS transistor P1, the difference voltage of two ends of the resistor R1 and the threshold voltage Vth of the NMOS transistor N1, that is, $V_{GS}=Vth+R_1*K*I_{PTAT}+\Delta V_{GS}$. Therefore, $Vov=R_1*K*I_{PTAT}+\Delta V_{GS}$. The gate-source difference voltage $\Delta V_{GS}$ of the PMOS transistor P1 decreases as the temperature falls and increases as the temperature rises, that is, $\Delta V_{GS}$ is the voltage difference with negative temperature coefficient (that curve shown as FIG. 2B), and $R_1*K*I_{PTAT}$ decreases as the temperature falls and increases as the temperature rises (that curve shown as FIG. 1B). By properly choosing the K value, the resistance value of R1, and/or the current value $I_{PTAT}$, as shown in FIG. 2B, an overdrive voltage Vov independent of the temperature variation may be obtained.

Please continuously refer to the embodiment of FIG. 1A or FIG. 2A. When the overdrive voltage Vov is independent of the temperature variation, since the turned-on resistance value $R_{DS(ON)}$ is inversely proportional to the carrier mobility and the overdrive voltage, and the carrier mobility has a negative temperature coefficient, it results in that the turned-on resistance value $R_{DS(ON)}$ has a positive temperature coefficient. In order to obtain the turned-on resistance value $R_{DS(ON)}$ independent of the temperature variation, the overdrive voltage $Vov=R_1*K*I_{PTAT}+\Delta V_{BE}$ of FIG. 1A or the overdrive voltage $Vov=R_1*K*I_{PTAT}+\Delta V_{GS}$ of FIG. 2A should be set as the positive temperature coefficient to compensate the carrier mobility with the negative temperature coefficient, so as to make the turned-on resistance value $R_{DS(ON)}$ of the NMOS transistor N2 be independent of the temperature variation. Simply speaking, the present disclosure may achieve that the overdrive voltage Vov or the turned-on resistance value $R_{DS(ON)}$ be independent of the temperature variation by choosing the resistance value R1, the value of K, and/or the current value of $I_{PTAT}$.

Figure 3:
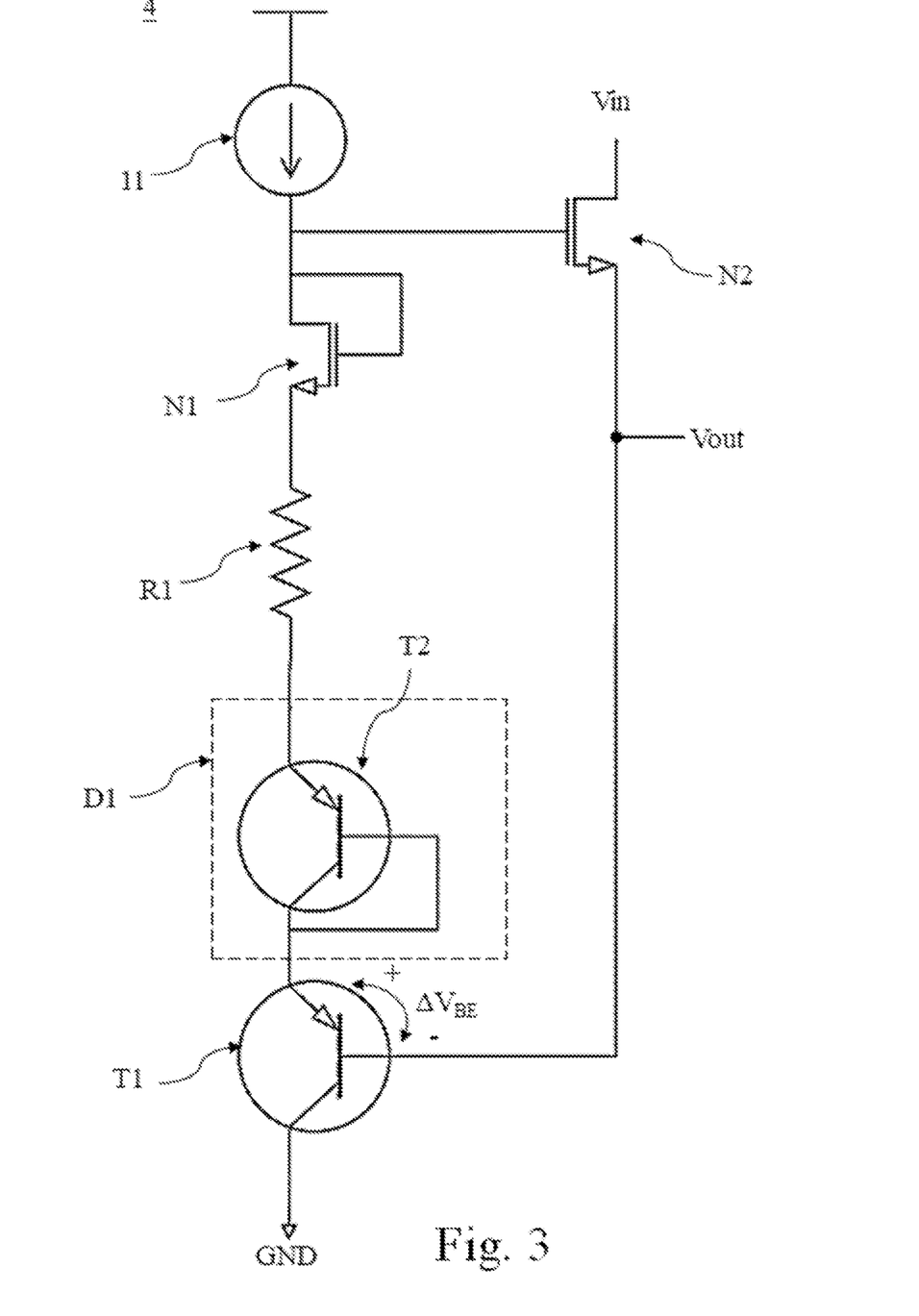
FIG. 3 is a circuit diagram of a driving circuit according to the third embodiment of the present disclosure.

Please refer to FIG. 3, FIG. 3 is a circuit diagram of a driving circuit according to the third embodiment of the present disclosure. It is different from the embodiment of FIG. 1A that the driving circuit 4 in FIG. 3 further includes a diode circuit D1. The diode circuit D1 is electrically connected to the one end of the resistor R1 and the emitter of the PNP bipolar junction transistor, and the diode circuit D1 is consisted of a diode-connected PNP bipolar junction transistor or a plurality of diode-connected PNP bipolar junction transistors in series connection. In FIG. 3, the diode circuit D1 is consisted of a diode-connected PNP bipolar junction transistor T2, the base of the PNP bipolar junction transistor T2 is connected to the collector of the PNP bipolar junction transistor T2, and the collector and the emitter of the PNP bipolar junction transistor T2 are electrically connected to the emitter of the PNP bipolar junction transistor T1 and the one end of the resistor R1, respectively.

In FIG. 3, assuming that the base-emitter voltage difference of the PNP bipolar junction transistor T2 is also $\Delta V_{BE}$, the calculated overdrive voltage Vov will be $Vov=R_1*K*I_{PTAT}+2*\Delta V_{BE}$. By properly selecting the K value, the resistance value R1 and/or the current value $I_{PTAT}$, an overdrive voltage Vov or a turned-on resistance value $R_{DS(ON)}$ independent of the temperature variation may be obtained. Similarly, when the diode circuit D1 is consisted of n (n is greater than or equal to 2) diode-connected PNP bipolar junction transistors in serial connection, the calculate overdrive voltage Vov will be $Vov=R_1*K*I_{PTAT}+n*\Delta V_{BE}$. By properly selecting the K value, the resistance value R1 and/or the current value $I_{PTAT}$, an overdrive voltage Vov or a turned-on resistance value $R_{DS(ON)}$ independent of the temperature variation may be obtained.

Figure 4:
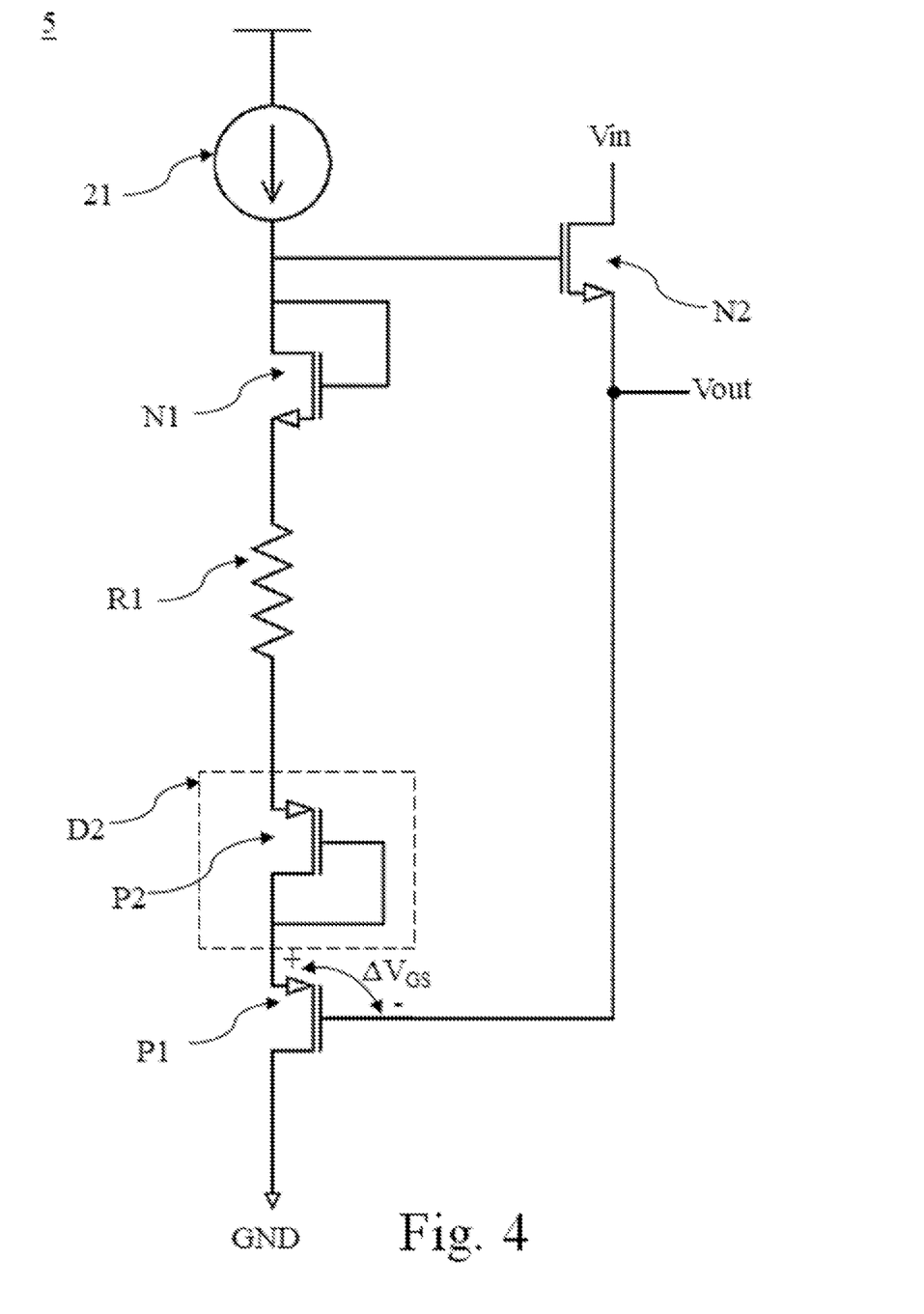
FIG. 4 is a circuit diagram of a driving circuit according to the fourth embodiment of the present disclosure.

Please refer to FIG. 4, FIG. 4 is a circuit diagram of a driving circuit according to the fourth embodiment of the present disclosure. It is different from the embodiment of FIG. 2A that the driving circuit 4 in FIG. 4 further includes the diode circuit D2, the diode circuit D2 is electrically connected to the one end of the resistor R1 and the source of the PMOS transistor P1. The diode circuit D1 is consisted of a diode-connected PNP bipolar junction transistor or a plurality of diode-connected PNP bipolar junction transistors connected in serial connection. In FIG. 4, the diode circuit D2 is consisted of a diode-connected PMOS transistor P2, the gate of the PMOS transistor P2 connected to the drain of the PMOS transistor P2, and the drain and the source of the PMOS transistor P2 are electrically connected to the source of the PMOS transistor P1 and the one end of the resistor R1 respectively.

In FIG. 4, assuming that the gate-source voltage difference of the PMOS transistor P2 is also $\Delta V_{GS}$, the calculated overdrive voltage Vov will be $Vov=R_1*K*I_{PTAT}+2*\Delta V_{GS}$. By properly selecting the K value, the resistance value R1 and/or the current value $I_{PTAT}$, an overdrive voltage $V_{OV}$ or a turned-on resistance value $R_{DS(ON)}$ independent of the temperature variation may be obtained. Similarly, when the diode circuit D2 is consisted of n (n is greater than or equal to 2) diode-connected PMOS transistor in series, the calculate overdrive voltage $V_{OV}$ will be $V_{OV}=R_1*K*I_{PTAT}+n*\Delta V_{GS}$. By properly selecting the K value, the resistance value R1 and/or the current value $I_{PTAT}$, an overdrive voltage $V_{OV}$ or a turned-on resistance value $R_{DS(ON)}$ independent of the temperature variation may be obtained.

Figure 5:
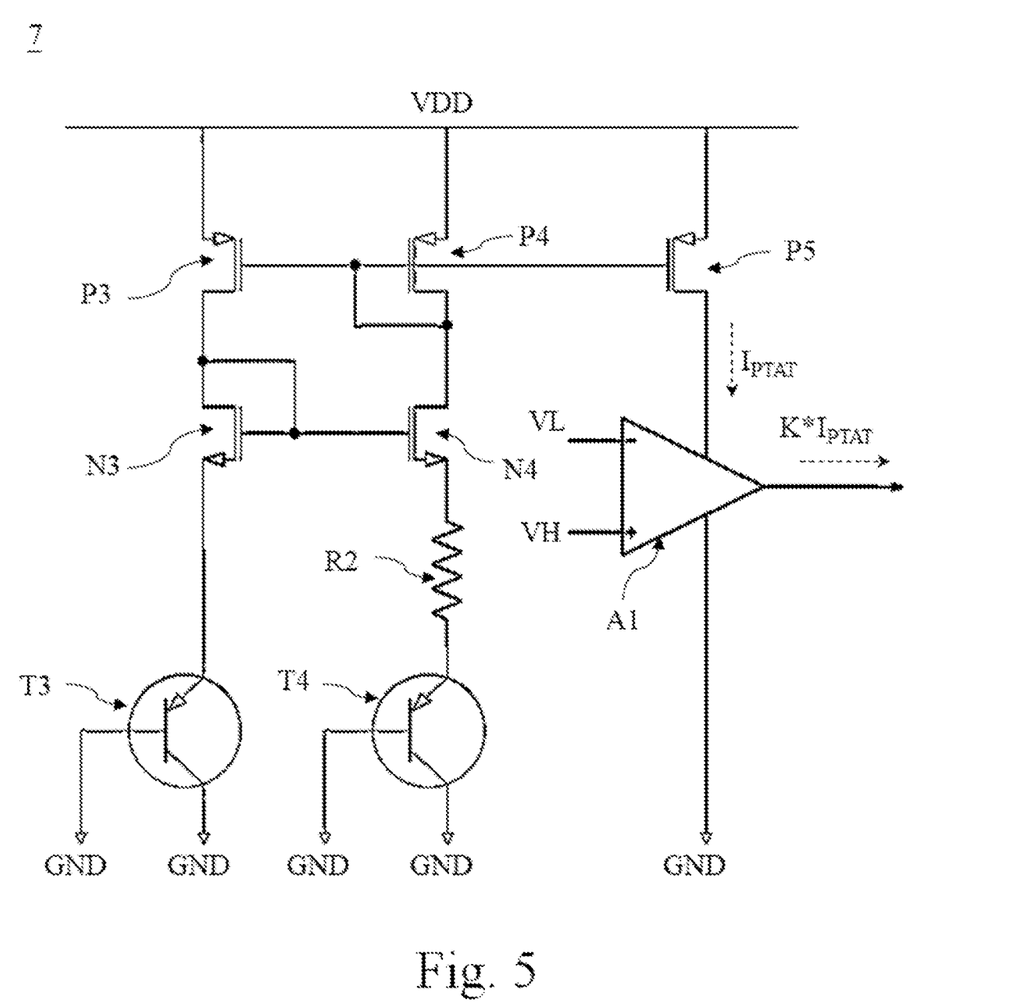
FIG. 5 is a circuit diagram of a current source according to an embodiment of the present disclosure.

Please refer to FIG. 5, FIG. 5 is a circuit diagram of a current source according to an embodiment of the present disclosure. The aforementioned current source 11 for providing a current with positive temperature coefficient may be implemented with the circuit structure of the current source 7 in FIG. 5, but the present disclosure is not limited thereto. The current source 7 includes the PMOS transistors P3-P5, the NMOS transistor N3, N4, the PNP bipolar junction transistor T3, T4, the resistor R2 and the amplifier A1. The negative input end of the amplifier A1 receives a voltage VL, and the positive input end of the amplifier A1 received a voltage VH (the voltage VH is higher than the voltage VL). The negative bias end is electrically connected to the ground voltage GND or other low voltage, and the positive bias end of the amplifier A1 is electrically connected to the drain of the PMOS transistor P5 to receive the current $I_{PTAT}$.

The source of the PMOS transistor P3, the source of the PMOS transistor P4 and the source of the PMOS transistor P5 receive the system voltage VDD. The gate of the PMOS transistor P3 is electrically connected to the gate of the PMOS transistor P4, the drain of the PMOS transistor P4 and the gate of the PMOS transistor P5. The drain of the PMOS transistor P3 is electrically connected to the drain of the NMOS transistor N3 and the gate of the NMOS transistor N3. The drain of the PMOS transistor P4 is electrically connected to the drain of the NMOS transistor N4.

The gate of the NMOS transistor N3 is electrically connected to the gate of the NMOS transistor N4, and the source of the NMOS transistor N3 is electrically connected to the emitter of the PNP bipolar junction transistor T3. Two ends of the resistor R2 are electrically connected to the source of the NMOS transistor N4 and the emitter of the PNP bipolar junction transistor T4 respectively, and the base of the PNP bipolar junction transistor T3, the collector of the PNP bipolar junction transistor T3, the base of the PNP bipolar junction transistor T4 and the collector of the PNP bipolar junction transistor T4 are electrically connected to the ground voltage GND or other low voltage.

Through the above-mentioned structure, the current $I_{PTAT}$ will be equal to $Vt*ln(n)/R_2$, and the output end of the amplifier A1 may be configured to output current $K*I_{PTAT}$, wherein K is determined by the difference between the voltage VH and the voltage VL, wherein Vt, as the thermal voltage, increases as the temperature rises and decreases as the temperature falls, n is the ideality factor and dependent of the process, and R2 is the resistance value of the resistor R2.

In the view of the above, the present disclosure provides various embodiments of different driving circuits. In some embodiments of the driving circuits, the overdrive voltage of the driving transistor is independent of the temperature variation, similar to the voltage generated by a temperature-independent bandgap voltage generator. In other embodiments of the driving circuits, the turned-on resistor of the driving transistor is independent of the temperature variation.

The present disclosure disclosed herein has been described by means of specific embodiments. However, numerous modifications, variations and enhancements can be made thereto by those skilled in the art without departing from the spirit and scope of the disclosure set forth in the claims.

What is claimed is:

1. A driving circuit, comprising:
   a current source, configured to provide a current with a positive temperature coefficient;
   a first NMOS transistor, wherein a drain of the first NMOS transistor is electrically connected to the current source, and configured to receive the current, and a gate of the first NMOS transistor is electrically connected to the drain of the first NMOS transistor;
   a second NMOS transistor, wherein a gate of the second NMOS transistor is electrically connected to the drain of the first NMOS transistor, a drain of the second NMOS transistor configured to receive an input voltage, and a source of the second NMOS transistor is configured to generate an output voltage for driving a load;
   a first resistor, wherein a first end of the first resistor is electrically connected to a source of the first NMOS transistor; and
   a first PNP bipolar junction transistor, wherein an emitter of the PNP bipolar junction transistor is electrically connected to a second end of the first resistor, a base of the PNP bipolar junction transistor is electrically connected to the source of the second NMOS transistor, and a collector of the first PNP bipolar junction transistor is electrically connected to a low voltage.

2. The driving circuit according to claim 1, wherein an overdrive voltage of the second NMOS transistor is a fixed voltage independent of temperature.

3. The driving circuit according to claim 1, wherein an overdrive voltage of the second NMOS transistor has a positive temperature coefficient, and a turned-on resistance value is independent of temperature.

4. The driving circuit according to claim 1, further comprising:
   a diode circuit, electrically connected between the second end of the first resistor and the emitter of the first PNP bipolar junction transistor, and comprising at least one second PNP bipolar junction transistor, wherein a base of the second PNP bipolar junction transistor is electrically connected to a collector of the second PNP bipolar junction transistor to configure as a diode.

5. The driving circuit according to claim 2, wherein the current source comprises:
   a third PMOS transistor, a fourth PMOS transistor and a fifth PMOS transistor;
   a third NMOS transistor, and a fourth PMOS transistor;
   a third PNP bipolar junction transistor, and a fourth PNP bipolar junction transistor;
   a second resistor; and
   an amplifier, wherein a negative input end of the amplifier receives a first voltage, a positive end of the amplifier receives a second voltage higher than the first voltage, and an output end of the amplifier is configured to output the current with a positive temperature coefficient;
   wherein a source of the third PMOS transistor, a source of the fourth PMOS transistor and a source of the fifth PMOS transistor receive a system voltage, a gate of the third PMOS transistor is electrically connected to a gate of the fourth PMOS transistor, a drain of the fourth PMOS transistor is electrically connected to a gate of the fifth PMOS transistor, a drain of the third PMOS transistor is electrically connected to a drain of the third NMOS transistor and a gate of the third NMOS transistor, the drain of the fourth PMOS transistor is electrically connected to the drain of the fourth NMOS transistor, the drain of the fifth PMOS transistor is electrically connected to a positive bias end of the amplifier, a gate of the third NMOS transistor is electrically connected to a gate of the fourth NMOS transistor, a source of the third NMOS transistor is electrically connected to an emitter of the third PNP bipolar junction transistor, two ends of the second transistor are electrically connected to a source of the fourth NMOS transistor and an emitter of the fourth PNP bipolar junction transistor, respectively, and a base of the third PNP bipolar junction transistor, a collector of the third PNP bipolar junction transistor, a base of the fourth PNP bipolar junction transistor, a collector of the fourth PNP bipolar junction transistor and a negative bias end of the amplifier are electrically connected to a low voltage.

6. A driving circuit, comprising:
   a current source, configured to provide a current with a positive temperature coefficient;
   a first NMOS transistor, wherein a drain of the first NMOS transistor is electrically connected to the current source and configured to receive the current, and a gate of the first NMOS transistor is electrically connected to the drain of the first NMOS transistor;
   a second NMOS transistor, wherein a gate of the second NMOS is electrically connected to the drain of the first NMOS transistor, a drain of the second NMOS transistor is configured to receive an input voltage, and a source of the second NMOS transistor is configured to generate an output voltage for driving a load;
   a first resistor, wherein a first end of the first resistor is electrically connected to a source of the first NMOS transistor; and
   a first PMOS transistor, wherein a source of the first PMOS transistor is electrically connected to a second end of the first resistor, a gate of the first PMOS transistor is electrically connected to the source of the second NMOS transistor, and a drain of the first PMOS transistor is electrically connected to a low voltage.

7. The driving circuit according to claim 6, wherein an overdrive voltage of the second NMOS transistor is a fixed voltage independent of temperature, or, the overdrive voltage of the second NMOS transistor has a positive temperature coefficient, and a turned-on resistance of the second NMOS transistor is independent of temperature.

8. The driving circuit according to claim 6, further comprising:
a diode circuit, electrically connected between the second end of the first resistor and the source of the first PMOS transistor, and comprising at least one second PMOS transistor, wherein a gate of the second PMOS transistor is electrically connected to a drain of the second PMOS transistor to configure as a diode.

9. The driving circuit according to claim 6, wherein the current source comprises:
a third PMOS transistor, a fourth PMOS transistor and a fifth PMOS transistor;
a third NMOS transistor, and a fourth PMOS transistor;
a third PNP bipolar junction transistor, and a fourth PNP bipolar junction transistor;
a second resistor; and
an amplifier, wherein a negative input end of the amplifier is configured to receive a first voltage, a positive end of the amplifier is configured to receive a second voltage higher than the first voltage, and an output end of the amplifier is configured to output the current with the positive coefficient;
wherein a source of the third PMOS transistor, a source of the fourth PMOS transistor and a source of the fifth PMOS transistor receive a system voltage, a gate of the third PMOS transistor electrically is electrically connected to a gate of the fourth PMOS transistor, a drain of the fourth PMOS transistor is electrically connected to a gate of the fifth PMOS transistor, a drain of the third PMOS transistor is electrically connected to a drain of the third NMOS transistor and a gate of the third NMOS transistor, the drain of the fourth PMOS transistor is electrically connected to the drain of the fourth NMOS transistor, the drain of the fifth PMOS transistor is electrically connected to a positive bias end of the amplifier, a gate of the third NMOS transistor is electrically connected to a gate of the fourth NMOS transistor, a source of the third NMOS transistor is electrically connected to an emitter of the third PNP bipolar junction transistor, two ends of the second transistor are electrically connected to a source of the fourth NMOS transistor and an emitter of the fourth PNP bipolar junction transistor respectively, and a base of the third PNP bipolar junction transistor, a collector of the third PNP bipolar junction transistor, a base of the fourth PNP bipolar junction transistor, a collector of the fourth PNP bipolar junction transistor and a negative bias end of the amplifier are electrically connected to a low voltage.

10. A circuit system, comprising:
a driving circuit, including:
a current source, configured to provide a current with a positive temperature coefficient;
a first NMOS transistor, wherein a drain of the first NMOS transistor is electrically connected to the current source, and configured to receive the current, and a gate of the first NMOS transistor is electrically connected to the drain of the first NMOS transistor;
a second NMOS transistor, wherein a gate of the second NMOS transistor is electrically connected to the drain of the first NMOS transistor, a drain of the second NMOS transistor configured to receive an input voltage, and a source of the second NMOS transistor is configured to generate an output voltage for driving a load;
a first resistor, wherein a first end of the first resistor is electrically connected to a source of the first NMOS transistor; and
a first PNP bipolar junction transistor, wherein an emitter of the PNP bipolar junction transistor is electrically connected to a second end of the first resistor, a base of the PNP bipolar junction transistor is electrically connected to the source of the second NMOS transistor, and a collector of the first PNP bipolar junction transistor is electrically connected to a low voltage; and
the load, electrically connected to the driving circuit.

11. The circuit system according to claim 10, wherein an overdrive voltage of the second NMOS transistor is a fixed voltage independent of temperature.

12. The circuit system according to claim 10, wherein an overdrive voltage of the second NMOS transistor has a positive temperature coefficient, and a turned-on resistance value is independent of temperature.

13. The circuit system according to claim 10, further comprising:
a diode circuit, electrically connected between the second end of the first resistor and the emitter of the first PNP bipolar junction transistor, and comprising at least one second PNP bipolar junction transistor, wherein a base of the second PNP bipolar junction transistor is electrically connected to a collector of the second PNP bipolar junction transistor to configure as a diode.

14. The circuit system according to claim 11, wherein the current source comprises:
a third PMOS transistor, a fourth PMOS transistor and a fifth PMOS transistor;
a third NMOS transistor, and a fourth PMOS transistor;
a third PNP bipolar junction transistor, and a fourth PNP bipolar junction transistor;
a second resistor; and
an amplifier, wherein a negative input end of the amplifier receives a first voltage, a positive end of the amplifier receives a second voltage higher than the first voltage, and an output end of the amplifier is configured to output the current with a positive temperature coefficient;
wherein a source of the third PMOS transistor, a source of the fourth PMOS transistor and a source of the fifth PMOS transistor receive a system voltage, a gate of the third PMOS transistor is electrically connected to a gate of the fourth PMOS transistor, a drain of the fourth PMOS transistor is electrically connected to a gate of the fifth PMOS transistor, a drain of the third PMOS transistor is electrically connected to a drain of the third NMOS transistor and a gate of the third NMOS transistor, the drain of the fourth PMOS transistor is electrically connected to the drain of the fourth NMOS transistor, the drain of the fifth PMOS transistor is electrically connected to a positive bias end of the amplifier, a gate of the third NMOS transistor is electrically connected to a gate of the fourth NMOS transistor, a source of the third NMOS transistor is electrically connected to an emitter of the third PNP bipolar junction transistor, two ends of the second transistor are electrically connected to a source of the fourth NMOS transistor and an emitter of the fourth PNP bipolar junction transistor, respectively, and a base of the third PNP bipolar junction transistor, a collector of the third PNP bipolar junction transistor, a base of the fourth PNP bipolar junction transistor, a collector of the fourth PNP bipolar junction transistor and a negative bias end of the amplifier are electrically connected to a low voltage.

* * * * *